United States Patent
Liang et al.

(10) Patent No.: US 11,114,168 B2
(45) Date of Patent: Sep. 7, 2021

(54) SENSE CIRCUIT AND SENSING OPERATION METHOD IN FLASH MEMORY DEVICES

(71) Applicant: Yangtze Memory Technologies Co., Ltd., Wuhan (CN)

(72) Inventors: Ke Liang, Wuhan (CN); Liang Qiao, Wuhan (CN); Chunyuan Hou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/814,952

(22) Filed: Mar. 10, 2020

(65) Prior Publication Data

US 2021/0174880 A1  Jun. 10, 2021

Related U.S. Application Data

(63) Continuation of application No. PCT/CN2019/123977, filed on Dec. 9, 2019.

(51) Int. Cl.

| | | |
|---|---|---|
| *G11C 11/34* | (2006.01) |
| *G11C 16/06* | (2006.01) |
| *G11C 16/26* | (2006.01) |
| *G11C 16/04* | (2006.01) |
| *G11C 16/08* | (2006.01) |
| *G11C 16/24* | (2006.01) |

(52) U.S. Cl.
CPC .......... *G11C 16/26* (2013.01); *G11C 16/0483* (2013.01); *G11C 16/08* (2013.01); *G11C 16/24* (2013.01)

(58) Field of Classification Search
CPC ......... G11C 16/26; G11C 16/08; G11C 16/24; G11C 16/0483
See application file for complete search history.

(56) References Cited

U.S. PATENT DOCUMENTS

| | | |
|---|---|---|
| 7,016,230 B2 | 3/2006 | Hosono |
| 7,606,076 B2 | 10/2009 | Nguyen |
| 8,107,293 B2 | 1/2012 | Yoshihara |
| 8,593,876 B2 | 11/2013 | Moschiano |

(Continued)

FOREIGN PATENT DOCUMENTS

| | | |
|---|---|---|
| CN | 102057439 A | 5/2011 |
| CN | 103165164 B | 9/2015 |

(Continued)

*Primary Examiner* — Toan K Le
(74) *Attorney, Agent, or Firm* — Winston Hsu

(57) ABSTRACT

A sense circuit of a memory cell includes a first switch, a sense node, a third switch, a connection node, a fourth switch, and a memory cell coupled in series. A boost driver is coupled to the sense node. A second switch and the connection node are coupled in series. The boost driver outputs a first voltage when the first, second, third, fourth switches are turned on. The third switch is then turned off and the boost driver outputs a second voltage higher than the first voltage such that the voltage level at the sense node is not higher than a system voltage. The third switch is turned on, then turned off and the boost driver outputs an intermediate voltage between the first voltage and the second voltage. A state of the memory cell is determined during output of the intermediate voltage.

20 Claims, 6 Drawing Sheets

(56) References Cited

U.S. PATENT DOCUMENTS

| | | | |
|---|---|---|---|
| 9,123,430 B2 | 9/2015 | Cernea | |
| 9,165,664 B2 | 10/2015 | D'Alessandro | |
| 10,366,739 B2 | 7/2019 | Amarnath | |
| 10,818,363 B1 * | 10/2020 | Valeri | G11C 16/107 |
| 2006/0114733 A1 | 6/2006 | Hosono | |
| 2016/0042799 A1 * | 2/2016 | D'Alessandro | G11C 16/26 |
| | | | 365/185.25 |
| 2018/0061497 A1 * | 3/2018 | Vu | G11C 16/30 |
| 2019/0237145 A1 | 8/2019 | Jo | |
| 2020/0194070 A1 * | 6/2020 | Lee | G11C 16/10 |

FOREIGN PATENT DOCUMENTS

| | | |
|---|---|---|
| CN | 105741877 A | 7/2016 |
| CN | 107978330 A | 5/2018 |
| CN | 109102829 A | 12/2018 |
| CN | 110097901 A | 8/2019 |

\* cited by examiner

SENSE CIRCUIT AND SENSING OPERATION METHOD IN FLASH MEMORY DEVICES

CROSS REFERENCE TO RELATED APPLICATIONS

This application is a continuation of application PCT/CN2019/123977, filed on Dec. 9, 2019, which is incorporated by reference herein in its entirety.

BACKGROUND OF THE INVENTION

1. Field of the Invention

The present invention is related to flash memory devices, and particularly to a sense circuit and sensing operations in flash memory devices.

2. Description of the Prior Art

Non-volatile memory is memory that can retain its stored data for an extended period without the application of power. Flash memory devices have developed into a popular type of non-volatile memory for a wide range of applications. Flash memory devices are commonly used in electronic systems, such as personal computers, digital cameras, digital media players, digital recorders, vehicles, wireless devices, cellular phones, and removable memory modules, and the uses for flash memory continue to expand.

Flash memory uses one of the two basic architectures known as NOR Flash and NAND Flash. Typically, an array of memory cells for NAND flash memory devices is arranged such that memory cells of a string are connected together in series, source to drain. A flash memory can comprise a memory array, which includes a large number of floating gate transistors. A NAND architecture array arranges its array of flash memory cells in a matrix of rows and columns, as a conventional NOR array does, so that the gates of each flash memory cell of the array are coupled by rows to word lines. However, unlike NOR, each memory cell is not directly coupled to a source line and a column bitline. Instead, the memory cells of the array are arranged together in strings, typically of 8, 16, 32, or more. The memory cells in the string are coupled together in series, source to drain, between a common source line and a column bitline.

Flash memory requires a sense circuit for performing at least a portion of sensing operations, such as read and verify operations, on selected memory cells. A boost scheme in the sensing operations is used to achieve more reliable sensing with higher accuracy. However, the boost schemes commonly applied have their problems such as leakage current, which can cause erroneous sensing. A new boost scheme is need to solve these problems.

SUMMARY OF THE INVENTION

An embodiment provides a method of operating a sense circuit of a memory cell. The sense circuit includes a first switch, a second switch, a third switch and a fourth switch. A first end of the first switch is coupled to a system voltage source outputting a system voltage. A second end of the first switch is coupled to a sense node, a first end of the third switch and a boost driver. A second end of the second switch is coupled to a second end of the third switch and a first end of the fourth switch. The method includes controlling the boost driver to output a first voltage and turning on the third switch while the first switch, the second switch and the fourth switch are turned on; after controlling the boost driver to output the first voltage and turning on the third switch, turning off the third switch; while the third switch is turned off, controlling the boost driver to output a second voltage higher than the first voltage such that the voltage level of the sense node is not higher than the system voltage; while the boost driver is outputting the second voltage, turning on the third switch; after the third switch is turned on while the boost driver is outputting the high voltage, turning off the third switch and controlling the boost driver to output an intermediate voltage between the first voltage and the second voltage; and determining a state of the memory cell while the boost driver outputs the intermediate voltage.

An embodiment provides a sense circuit including a boost driver, a first switch, a second switch, a third switch and a fourth switch. The boost driver coupled to a sense node is configured to provide a boost voltage. The first switch includes a first end coupled to a system voltage source and a second end coupled to the sense node. A second switch includes a first end coupled the system voltage source and a second end. The third switch includes a first end coupled to the sense node and a second end coupled to the second end of the second switch. The fourth switch includes a first end coupled to the second end of the second switch and a second end coupled to a string of memory cells.

An embodiment provides a method of operating a sense circuit of a memory cell. The sense circuit includes a sense node, a switch, and the memory cell coupled in series, and a boost driver coupled to the sense node. The method includes controlling the boost driver to output a first voltage and turning on the third switch while the first switch, the second switch and the fourth switch are turned on; after controlling the boost driver to output the first voltage and turning on the third switch, turning off the third switch; while the third switch is turned off, controlling the boost driver to output a second voltage higher than the first voltage such that the voltage level of the sense node is not higher than the system voltage; while the boost driver is outputting the second voltage, turning on the third switch; after the third switch is turned on while the boost driver is outputting the high voltage, turning off the third switch and controlling the boost driver to output an intermediate voltage between the first voltage and the second voltage; and determining a state of the memory cell while the boost driver outputs the intermediate voltage.

An embodiment provides a memory device comprising a plurality of memory cells, a plurality of bitline transistors each coupled to one end of a corresponding column of the plurality of memory cells, a plurality of source line transistors each coupled to another end of the corresponding column of the plurality of memory cells, and a sense circuit coupled to each column of the plurality of memory cells. The sense circuit includes a boost driver, a first switch, a second switch, a third switch and a fourth switch. The boost driver coupled to a sense node is configured to provide a boost voltage. The first switch includes a first end coupled to a system voltage source and a second end coupled to the sense node. A second switch includes a first end coupled the system voltage source and a second end. The third switch includes a first end coupled to the sense node and a second end coupled to the second end of the second switch. The fourth switch includes a first end coupled to the second end of the second switch and a second end.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, reference is made to the accompanying drawings that form a part specific embodiments.

Figure 1:
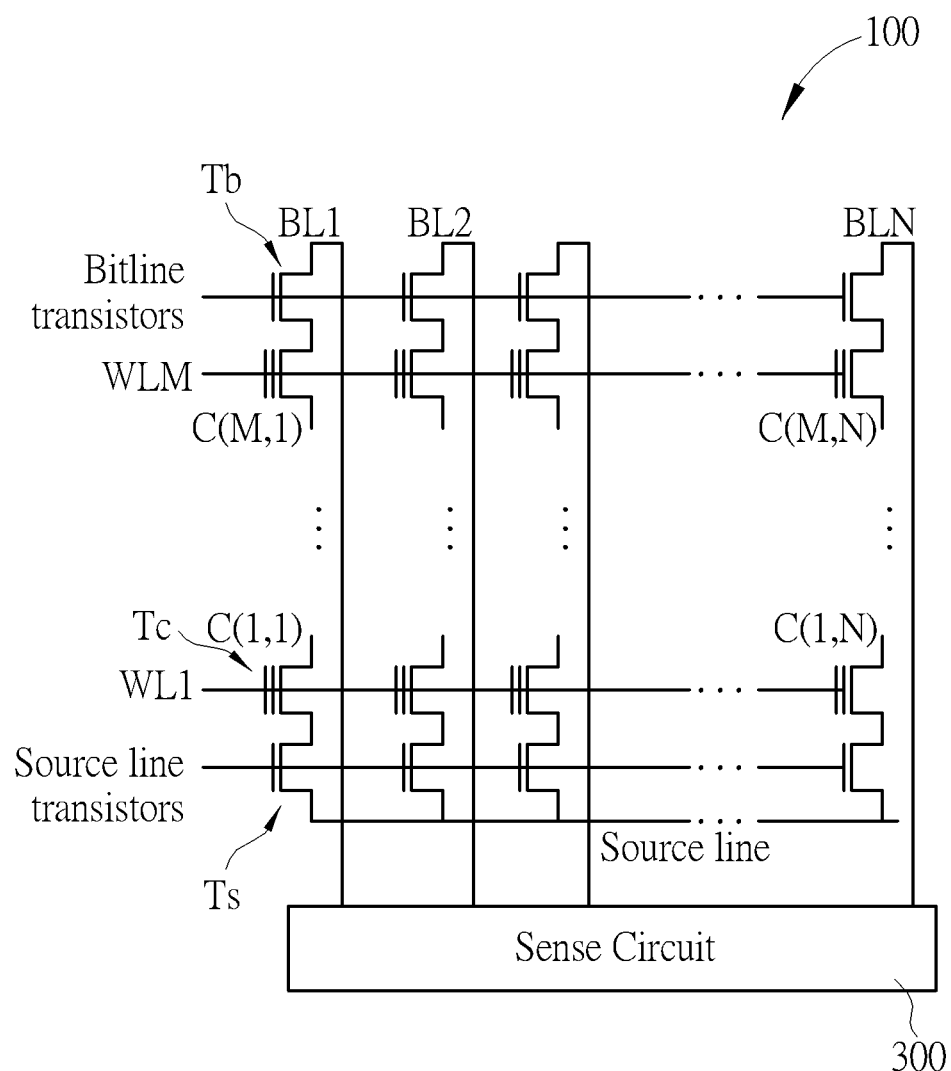
FIG. 1 is a diagram of a flash memory device of an embodiment.

FIG. 1 shows a flash memory device 100 of an embodiment of the present invention. The non-volatile memory device 100 includes a plurality of memory cells C(1,1) to C(M,N), where M and N are positive integers. Each memory cell includes a floating gate transistor. In some embodiments of the present invention, the non-volatile memory device 100 can be a NAND type flash memory. N memory cells can be coupled to the same wordline and M memory cells can be coupled to the same bitline. For example, a row of memory cells C(1,1) to C(1,N) can be coupled to a wordline WL1, and a row of memory cells C(M,1) to C(M,N) can be coupled to a wordline WLM. A column of memory cells C(1,1) to C(M,1) can be coupled to a bitline BL1, and a column of memory cells C(M,1) to C(M,N) can be coupled to a bitline BLN. One terminal of a memory column is coupled to a bitline via a bitline transistor Tb corresponding to that memory column and the other terminal is coupled to a source line via a source line transistor Ts. The bitlines BL1 to BLN are coupled to sense circuits (e.g., sense amplifier) 300 that detect the state of a target memory cell by sensing voltage or current on a selected bitline BLn, where n is a positive integer between 1 and N inclusively. The flash memory device 100 further includes a control circuit for implementing programming pulses to the memory cell array.

Memory cells C(1,1) to C(M,N) can be configured as single level memory cells (SLC) or multilevel memory cells (MLC). A data state is assigned to a memory cell with a specific range of threshold voltages stored in the memory cell. SLC allows a data of single binary digit in one memory cell, while MLC allows two or more binary digits to be stored in one memory cell depending on the range and tightness of the threshold voltage. For example, one bit may be represented by two threshold voltage ranges, two bits by four ranges and three bits by eight ranges . . . etc. SLC memory uses two threshold voltage ranges to store a single bit of data (two ranges), representing 0 or 1. MLC memory can be configured to store two bits of data (four ranges), three bits of data (eight ranges) or more.

Figure 2:
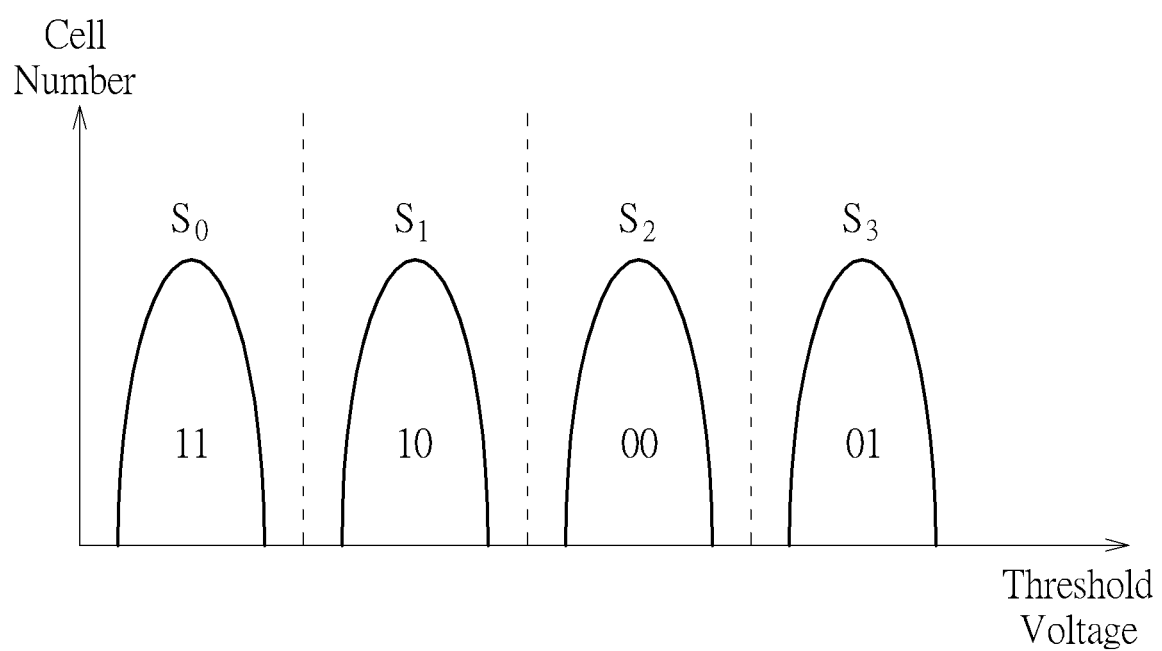
FIG. 2 is diagram of an example of threshold voltage ranges of 2-bit MLC memory cells.

FIG. 2 is diagram of an example of threshold voltage ranges of 2-bit MLC memory cells. A memory cell might be programmed to a threshold voltage that falls within one of four different ranges S0, S1, S2 and S3; each represent a data state corresponding to a pattern of two bits. A margin is maintained between each range S0 to S3 to prevent overlapping. For example, if the voltage of a memory cell falls within the first threshold voltage range S0, the cell stores a "11" state, which usually represents an erased state. If the voltage of a memory cell falls within the second threshold voltage range S1, the cell stores a "10" state. If the voltage of a memory cell falls within the third threshold voltage range S2, the cell stores a "00" state. If the voltage of a memory cell falls within the fourth threshold voltage range S3, the cell stores a "01" state.

Flash memory cells are programmed by programming cycles. Memory cells of a certain block are first erased and then selective cells are programmed. For a NAND array, a block of cells is erased by setting all the wordlines to ground voltage and applying an erase voltage to the substrate where the block of cells are formed. This removes the charges trapped in the floating gates or other charge trap structures of the transistors, making the resulting threshold voltage of the memory cells fall in the range of S0, which can represent an erased state.

Flash programming involves applying one or more programming pulses to a wordline, for example wordline WLm in FIG. 1, where m is an integer between 1 and M. This is to control the gate of each memory cell C(m,1) to C(m,N). For example, programming pulses may start at 15V and increase for each subsequent programming pulse. This programming method is commonly known incremental step pulse programming (ISPP). While a programming pulse is applied to the wordline WLm, a voltage is also applied to substrate having the channels of these memory cells resulting in a charge transfer from the channel to the floating gates of the selected memory cells. Electrons from the channels can be injected into the floating gates through direct injection or Fowler-Nordheim tunneling. Therefore, in a programmed state the threshold voltage is usually greater than zero.

Also in FIG. 1, a pass voltage is applied to each unselected wordline, for example, wordlines WL1 to WLM except WLm. The pass voltages applied may be different on different wordlines. A wordline adjacent to the selected wordline WLm may have pass voltage of 9V and the other wordline $WLm_{-1}$ may have pass voltage of 8V. The pass voltages are always low enough to not initiate programming of memory cells. Also, an inhibit voltage is applied to the bitlines which are not coupled to the memory cell strings having memory cells selected for programming. During the programming operation, alternate bitlines may be activated or deactivated for programming. For example, even number bitlines such as BL2, BL4 . . . etc, can be activated for programming memory cells coupled to these bitlines while the odd numbered bitlines such as BL1, BL3 . . . etc, are deactivated from programming memory cells coupled to these bitlines. A subsequent programming operation can then deactivate the even number bitlines and activate the odd number bitlines.

Between the programming pulses, a sensing operation (e.g., verify operation) is performed to check the selected memory cells to determine whether they have reached their intended programming state. For example, if a memory cell C(m,n) has reached its intended programming state, it is inhibited and will not be programmed any further by biasing an inhibit voltage to the bitline BLn coupled to the memory cell C(m,n). Following the sensing operation, an additional programming pulse is applied if there are still memory cells having not completed programming. This process of applying programming pulses followed by performing the sensing operation continues until all the selected memory cells have reached their intended programmed states. When a maximum number of programming pulses have been applied and some selected memory cells still have not completed programming, those memory cells would be designated as defective memory cells.

Figure 3:
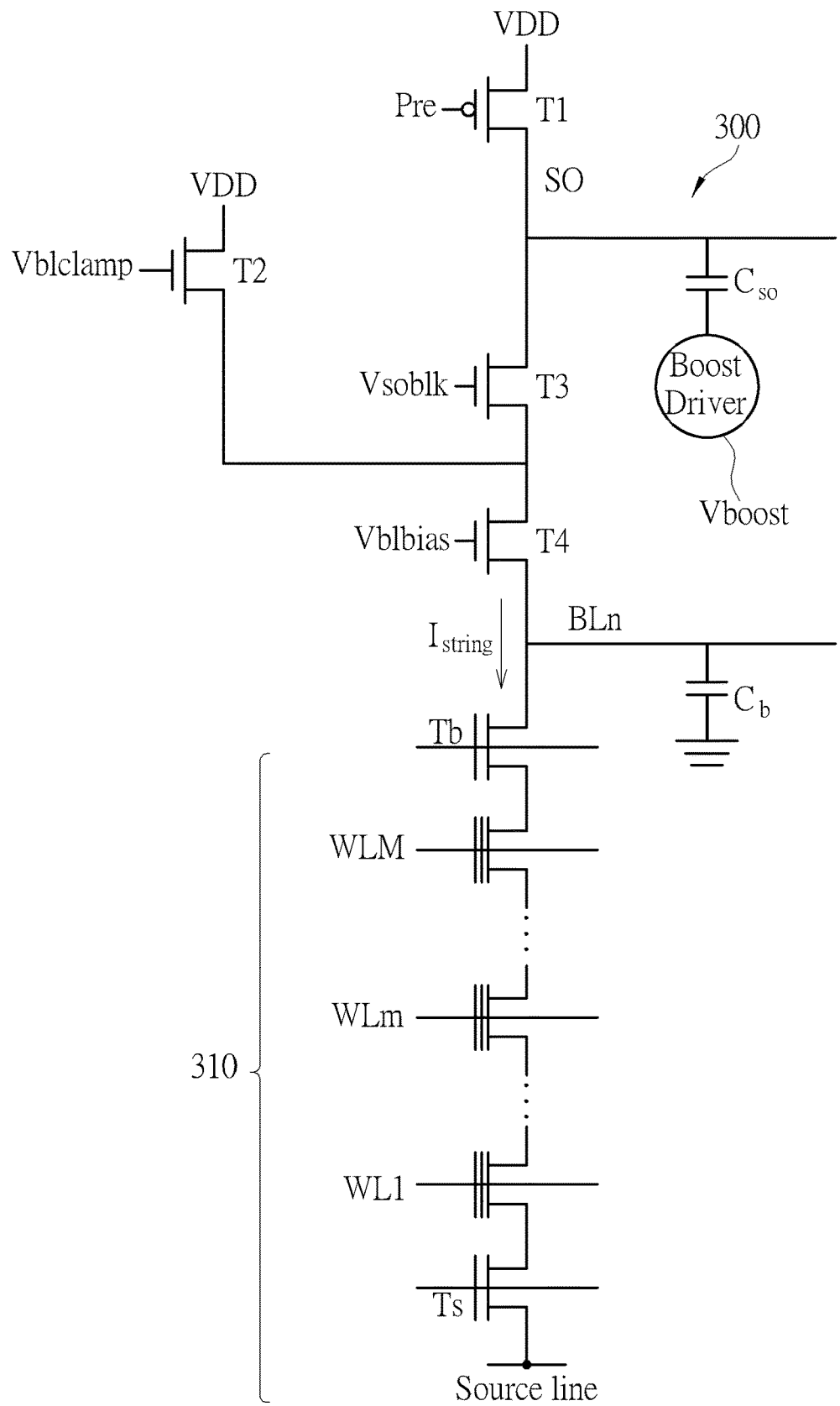
FIG. 3 shows a diagram of a sense circuit implemented for the sensing operation in an embodiment of the present invention.

Sense circuits are used in flash memory devices to perform a sensing operation (e.g., read and/or verify) on the selected memory cells. FIG. 3 shows a diagram of sense circuit 300 implemented for the sensing operation in an embodiment of the present invention. The sense circuit 300 comprises a first switch T1, a second switch T2, a third switch T3 and a fourth switch T4. A second end of the first switch T1 is coupled to a first end of the third switch T3 and a boost driver Vboost configured to provide a boost voltage. This coupling node is called a sense node SO. A second end of the second switch T2 is coupled to a second end of the third switch T3 and a first end of the fourth switch T4. A first end of the first switch T1 and a first end of the second switch T2 are given a system voltage VDD. A second end of the fourth switch T4 is coupled to a bitline BLn and a memory cell string 310. Capacitor $C_{so}$ coupled between the sense node SO and the boost driver Vboost is the parasitic capacitor formed at the sense node SO. Capacitor $C_b$ coupled between the bitline BLn and ground is the parasitic capacitor formed by the bitline BLn and the memory cell string 310. The first switch T1 can be implemented with a PMOS (P-type metal oxide semiconductor) transistor. The second switch T2, the third switch T3 and the fourth switch T4 can be implemented by NMOS (N-type metal oxide semiconductor) transistors.

During the precharge phase of the sensing operation, a precharge current is injected into the sense node SO by turning on the first switch T1 by setting a signal PRE to a certain voltage level, thus raising the voltage level of the sense node SO to the system voltage VDD. A signal Vblclamp is applied to turn on the second switch T2 and another signal Vblbias is applied to turn on the fourth switch T4. The third switch T3 is turned off as indicated by a signal Vsoblk being deactivated.

Following the precharge phase, the wordlines coupled to unselected memory cells can be given a pass voltage. The pass voltage causes the unselected memory cells coupled to those wordlines to operate in a pass mode regardless of their state. The wordline WLm coupled to the selected memory cell C(m,n) is then biased with a sensing voltage to determine the data state of the memory cell C(m,n). If the threshold voltage of the memory cell C(m,n) is above the sensing voltage, the memory cell C(m,n) would not be activated and the bitline BLn would remain at a precharge voltage. If the threshold voltage of the memory cell C(m,n) is below the sensing voltage, the memory cell C(m,n) would be activated and the bitline BLn will be discharged through the memory cell string 310. The voltage at the sense node SO would also be pulled down. Then, the sense circuit 300 detects whether the bitline BLn and the sense node SO is discharged during the sensing operation to determine the data state of the memory cell C(m,n).

The sense circuit 300 is configured to have a sensing trigger level established at the sense node SO. The sensing trigger level can be a particular voltage at the sense node SO. At the end of sensing operation, when the voltage at the sense node SO is lower than the sensing trigger level, the memory cell C(m,n) can be determined to be in an erased state. When the voltage at the sense node SO is higher than the sensing trigger level, the memory cell C(m,n) can be determined to be in an programmed state. One way of increasing the sensing margin between the programmed state and the erased state is by applying a boost scheme. Typically, the boost driver Vboost outputs a high voltage at the beginning of the sensing phase. This would raise the voltage of the sense node SO above the level of the system voltage VDD. However, this can cause a leakage current in the switch T1 of the sense circuit 300, which can potentially cause erroneous indication of the data state of the memory cell C(m,n). Therefore, a new method is needed to solve this problem.

Figure 4:
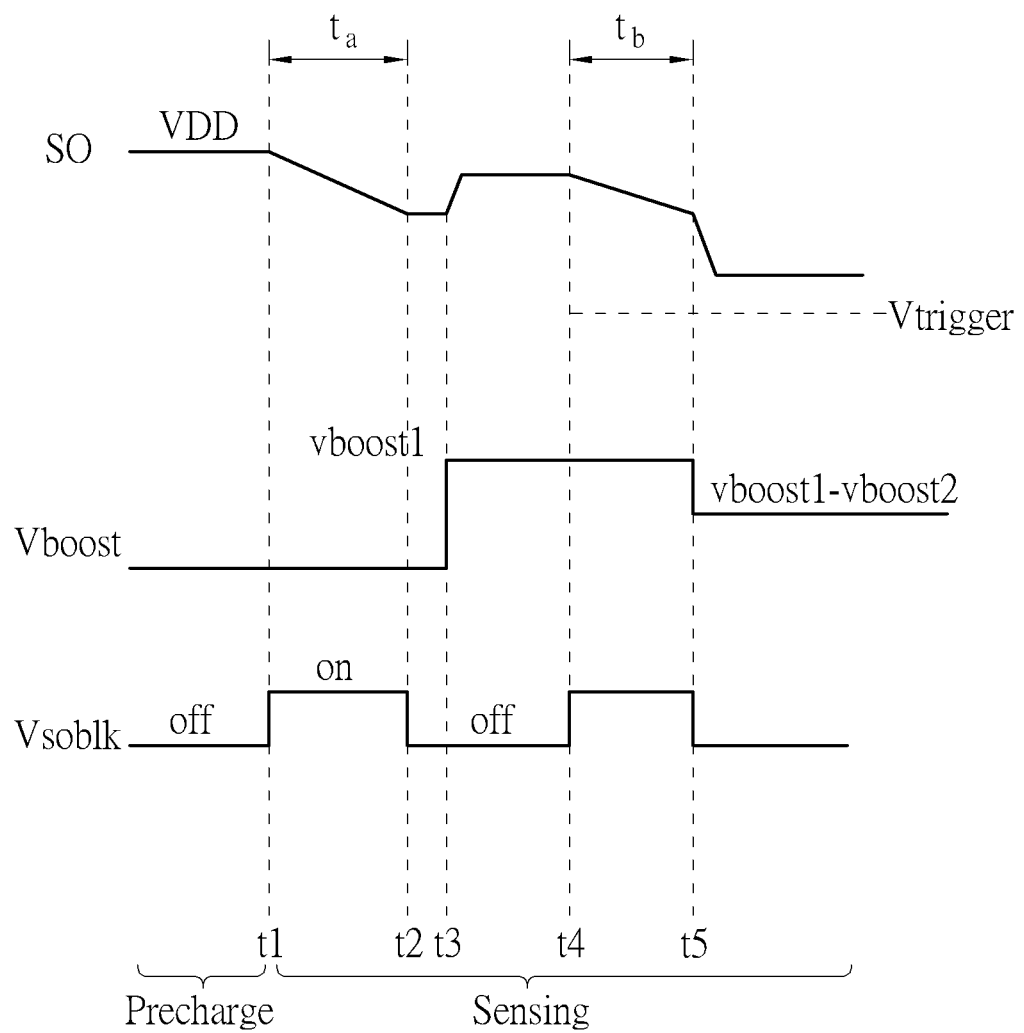
FIG. 4 is a diagram of the waveform of a boost scheme for a sensing operation of an embodiment of the present invention.
Figure 5:
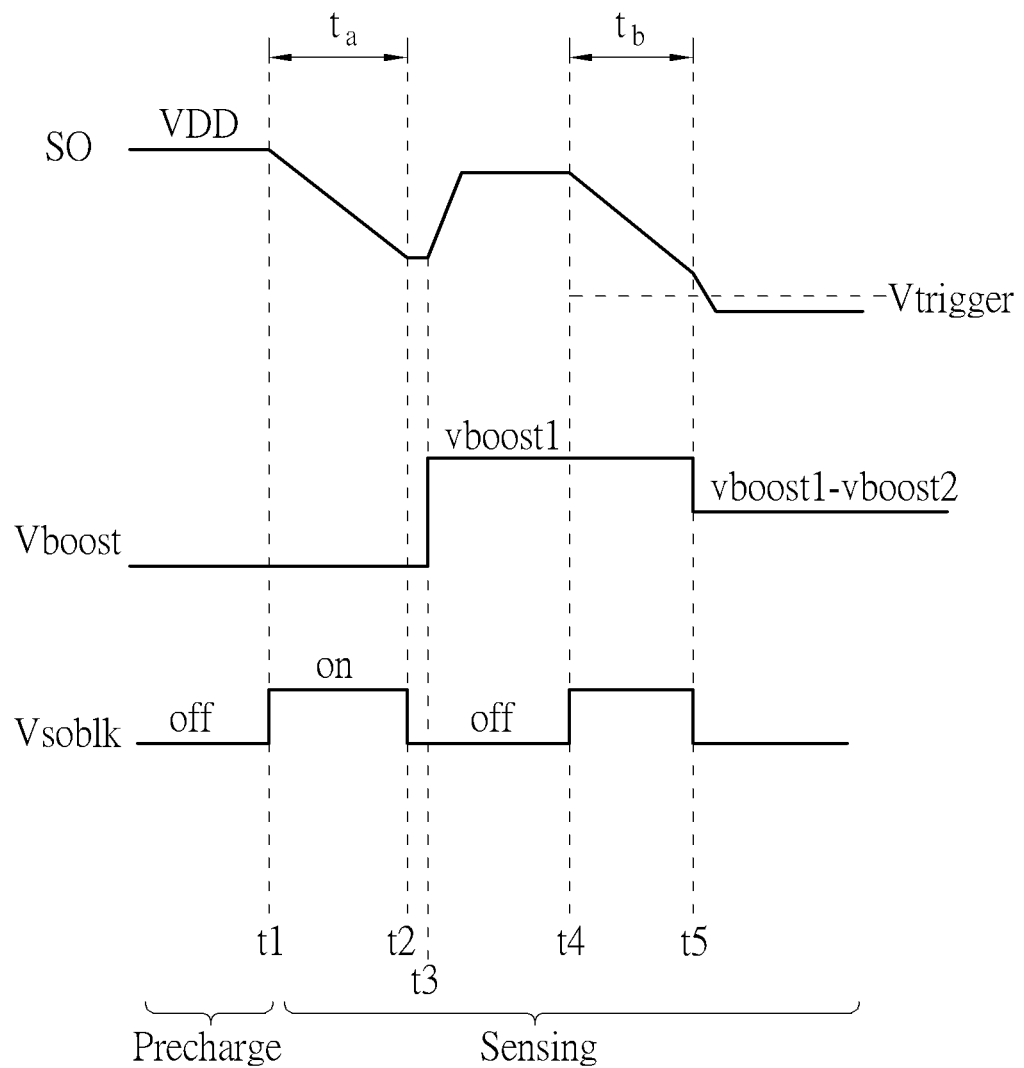
FIG. 5 is a diagram of the waveform of a boost scheme for a sensing operation of an embodiment of the present invention.

A boost scheme for sensing operation is proposed to solve the above-mentioned problem. FIGS. 4 and 5 are diagrams of the waveform of a boost scheme for a sensing operation of an embodiment of the present invention. As shown in FIGS. 4 and 5, during the precharge phase, the first switch T1 is turned on and the sense node SO is charged to the system voltage VDD. The boost driver Vboost is set at ground level and the signal Vsoblk for controlling the third switch T3 is at "on" level indicating the third switch T3 is on. Although not shown in the figure, the signal Vblclamp for controlling the second switch T2 and the signal Vblbias for controlling the fourth switch T4 are both activated during the entire sensing operation.

The following description refers to FIGS. 3, 4 and 5. The sensing phase begins at time t1, the sense node SO starts to be discharged through memory cell string 310. After a certain duration $t_a$, at time t2, the third switch T3 is turned off as indicated by the signal Vsoblk being set to "off" level. The discharging of the sense node SO stops as the discharging current path is cut off. Following the turning off of the signal Vsoblk, at time t3 the boost driver Vboost outputs a high voltage vboost1 to start charging the sense node SO. When the voltage at the sense node SO reaches a certain level, the signal Vsoblk is set at "on" level again to turn on the third switch T3 and the sense node SO starts to discharge again. After a duration $t_b$, at time t5, the boost driver Vboost lowers its output voltage by a voltage vboost2, setting the output voltage of the boost driver Vboost to be vboost1−vboost2. The voltage at the sense node SO would continue to drop to a steady state level. At this time, the voltage at the sense node is compared with a predetermined sensing voltage Vtrigger. If the voltage at the sense node is higher than the sensing voltage Vtrigger as shown in FIG. 4, the selected memory cell C(m,n) is determined to be in a programmed state. If the voltage at the sense node is lower than the sensing voltage Vtrigger as shown in FIG. 5, the selected memory cell C(m,n) is determined to be in an erased state.

Alternatively, the data state of the selected memory cell C(m,n) can be determined by comparing the magnitude of a discharging string current $I_{string}$ with a target sensing current $I_{sense}$. If the magnitude of string current $I_{string}$ is smaller than the sensing current $I_{sense}$, the selected memory cell C(m,n) is determined to be in a programmed state. If the magnitude of string current $I_{string}$ is larger than the sensing current $I_{sense}$, the selected memory cell C(m,n) is determined to be in an erased state.

The time duration $t_a$ and $t_b$ in FIGS. 4 and 5 can be defined as:

$$I_{sense} \times t_a = C_{so} \times (v\text{boost1} - \alpha)$$

$$I_{sense} \times t_b = C_{so} \times (VDD - \alpha - v\text{boost2})$$

$I_{sense}$ is the target sensing current. $C_{so}$ is the characteristic capacitance at the sense node SO. α is a predetermined constant as the margin for sensing variation.

Figure 6:
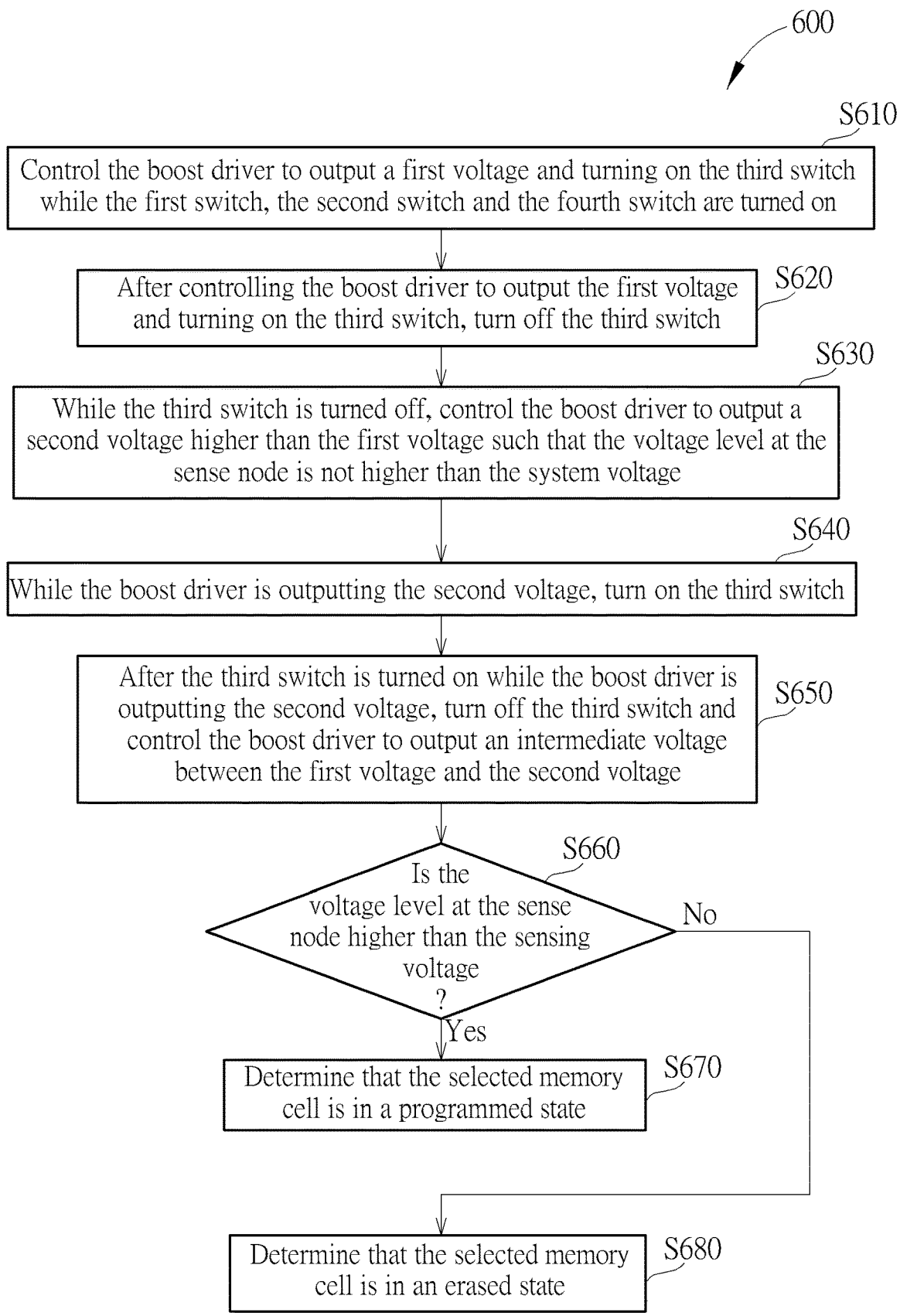
FIG. 6 is a method of the sensing operation of an embodiment of present invention.

FIG. 6 is a method 600 of the sensing operation of an embodiment of present invention. It comprises the following steps:

S610: Control the boost driver Vboost to output a first voltage and turning on the third switch T3 while the first switch T1, the second switch T2 and the fourth switch T4 are turned on;

S620: After controlling the boost driver Vboost to output the first voltage and turning on the third switch T3, turn off the third switch T3;

S630: While the third switch T3 is turned off, control the boost driver Vboost to output a second voltage higher than the first voltage such that the voltage level at the sense node SO is not higher than the system voltage VDD;

S640: While the boost driver is outputting the high voltage, turn on the third switch T3;

S650: After the third switch T3 is turned on while the boost driver Vboost is outputting the second voltage, turn off the third switch T3 and control the boost driver Vboost to output an intermediate voltage between the second voltage and the first voltage;

S660: Compare the voltage level at the sense node SO with the sensing voltage Vtrigger; if the voltage level of the sense node SO is higher than the sensing voltage Vtrigger, proceed to step S670, else proceed to step 680;

S670: Determine that the selected memory cell is in a programmed state.

S680: Determine that the selected memory cell is in an erased state.

In summary, the sense circuit and the sensing operation method of the present invention apply a new boost scheme such that the voltage level at the sense node would not exceed the system voltage. It can effectively eliminate the leakage current in the sense circuit, therefore achieving more precise sensing to determine the data state of the selected memory cells with higher accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating a sense circuit of a memory cell, the sense circuit comprising a first switch, a second switch, a third switch and a fourth switch, a first end of the first switch being coupled to a system voltage source outputting a system voltage, a second end of the first switch being coupled to a sense node, a first end of the third switch and a boost driver, a second end of the second switch being coupled to a second end of the third switch and a first end of the fourth switch, the method comprising:
controlling the boost driver to output a first voltage and turning on the third switch while the first switch, the second switch and the fourth switch are turned on;
after controlling the boost driver to output the first voltage and turning on the third switch, turning off the third switch;
while the third switch is turned off, controlling the boost driver to output a second voltage higher than the first voltage such that the voltage level of the sense node is not higher than the system voltage;
while the boost driver is outputting the second voltage, turning on the third switch;
after the third switch is turned on while the boost driver is outputting the high voltage, turning off the third switch and controlling the boost driver to output an intermediate voltage between the first voltage and the second voltage; and
determining a state of the memory cell while the boost driver outputs the intermediate voltage.

2. The method of claim 1 further comprising:
comparing a voltage level of the sense node with a predetermined voltage; and
if the voltage level of the sense node is higher than the predetermined voltage, determining that the memory cell is in a programmed state.

3. The method of claim 1 further comprising:
comparing a voltage level of the sense node with a predetermined voltage; and
if the voltage level of the second end of the first switch is lower than the predetermined voltage, determining that the memory cell is in an erased state.

4. The method of claim 1 wherein the sense circuit has a parasitic capacitor formed between the second end of the first switch and the boost driver.

5. The method of claim 1 wherein the sense circuit has a parasitic capacitor formed between a second end of the fourth switch and ground.

6. The method of claim 1 wherein a second end of the fourth switch is coupled to a string of memory cells.

7. The method of claim 1 wherein the first switch is a PMOS (P-type metal oxide semiconductor) transistor.

8. The method of claim 1 wherein the second switch, the third switch and the fourth switch are NMOS (N-type metal oxide semiconductor) transistors.

9. A sense circuit comprising:
a boost driver coupled to a sense node, configured to provide a boost voltage;
a first switch comprising:
a first end coupled to a system voltage source; and
a second end coupled to the sense node;
a second switch comprising:
a first end coupled the system voltage source; and
a second end;
a third switch comprising:
a first end coupled to the sense node; and
a second end coupled to the second end of the second switch; and
a fourth switch comprising:
a first end coupled to the second end of the second switch; and
a second end coupled to a string of memory cells.

10. The sense circuit of claim 9 wherein a parasitic capacitor is formed between the second end of the first switch and the boost driver.

11. The sense circuit of claim 9 wherein a parasitic capacitor is formed between the second end of the fourth switch and ground.

12. The sense circuit of claim 9 wherein the first switch is a PMOS (P-type metal oxide semiconductor) transistor.

13. The sense circuit of claim 9 wherein the second switch, the third switch and the fourth switch are NMOS (N-type metal oxide semiconductor) transistors.

14. A method of operating a sense circuit of a memory cell, the sense circuit comprising a sense node, a switch, and the memory cell coupled in series, and a boost driver coupled to the sense node, the method comprising:
turning on the switch;
the boost driver outputting a first voltage to the sense node after the switch has been turned on;
turning off the switch after it has been turned on;

the boost driver outputting a second voltage higher than the first voltage after the switch has been turned off, the second voltage such that a voltage level at the sense node is not higher than a system voltage;

turning on the switch while the boost driver outputs the second voltage;

turning off the switch after the switch has been turned on while the boost driver outputs the second voltage and the boost driver outputting an intermediate voltage between the first voltage and the second voltage; and determining a state of the memory cell while the boost driver outputs the intermediate voltage.

15. A memory device comprising:
a plurality of memory cells;
a plurality of bitline transistors each coupled to one end of a corresponding column of the plurality of memory cells;
a plurality of source line transistors each coupled to another end of the corresponding column of the plurality of memory cells;
a sense circuit coupled to each column of the plurality of memory cells, comprising:
   a boost driver coupled to a sense node, configured to provide a boost voltage;
   a first switch comprising:
     a first end coupled to a system voltage source; and
     a second end coupled to the sense node;
   a second switch comprising:
     a first end coupled the system voltage source; and
     a second end;
   a third switch comprising:
     a first end coupled to the sense node; and
     a second end coupled to the second end of the second switch; and
   a fourth switch comprising:
     a first end coupled to the second end of the second switch; and
     a second end.

16. The memory device of claim 15, further comprising a control circuit configured to implement programming pulses to the memory cells.

17. The memory device of claim 15, wherein each row of the memory cells is coupled to a wordline.

18. The memory device of claim 15, wherein each column of the memory cells is coupled to a bitline.

19. The memory device of claim 15, wherein each of the memory cells comprises a floating gate transistor.

20. The memory device of claim 15, wherein the sense circuit is configured to detect a state of a memory cell of the plurality of memory cells.

* * * * *